United States Patent

Hood, Jr. et al.

[11] Patent Number: 5,245,226
[45] Date of Patent: Sep. 14, 1993

[54] OUTPUT LOGIC MACROCELL

[75] Inventors: Milton M. Hood, Jr., Lake Oswego; David L. Rutledge, Newberg, both of Oreg.; Kapil Shankar, San Jose; Rudolf Usselmann, Mountain View, both of Calif.

[73] Assignee: Lattice Semiconductor Corporation, Hillsboro, Oreg.

[21] Appl. No.: 661,285

[22] Filed: Feb. 25, 1991

[51] Int. Cl.[5] .................................... H03K 19/173
[52] U.S. Cl. .............................. 307/465; 307/465.1; 307/471
[58] Field of Search ........................ 307/465-469, 307/471, 443

[56] References Cited

U.S. PATENT DOCUMENTS

| | | | |
|---|---|---|---|
| 4,758,746 | 7/1988 | Birkner et al. | 307/465 |
| 4,763,020 | 8/1988 | Takata et al. | 307/465 |
| 4,857,773 | 8/1989 | Takata et al. | 307/465 |
| 5,023,484 | 6/1991 | Pathak et al. | 307/480 |

Primary Examiner—Edward P. Westin
Assistant Examiner—Andrew Sanders
Attorney, Agent, or Firm—Skjerven, Morrill, MacPherson, Franklin & Friel

[57] ABSTRACT

A macrocell is provided for use in logic circuits which is capable of being configured into any one of six different states so as to replicate an X-type output architecture, an L-type output architecture and a number of hybrid architectures which encompass features from one or both of these types.

12 Claims, 6 Drawing Sheets

FIG. 1

(PRIOR ART)

FIG. 2

(PRIOR ART)

OUTPUT LOGIC MACROCELL

FIELD OF THE INVENTION

This invention relates to programmable logic arrays and in particular to an Output Logic Macrocell ("OLMC") suitable for use in a programmable logic array to allow the array to be configured to represent any one of a number of the existing architectures associated with programmable logic devices.

BACKGROUND OF THE INVENTION

Programmable logic arrays are well known. U.S. Pat. No. 4,124,899, for example, describes both the background and the uses of programmable logic arrays and field programmable logic arrays. U.S. Pat. No. 4,717,912 discloses an improved version of the programmable logic array described in U.S. Pat. No. 4,124,899 wherein an output cell is provided to allow a single circuit to be configured to simulate a programmable logic array having a combinatorial unregistered output lead or a registered output lead.

Figure 1:
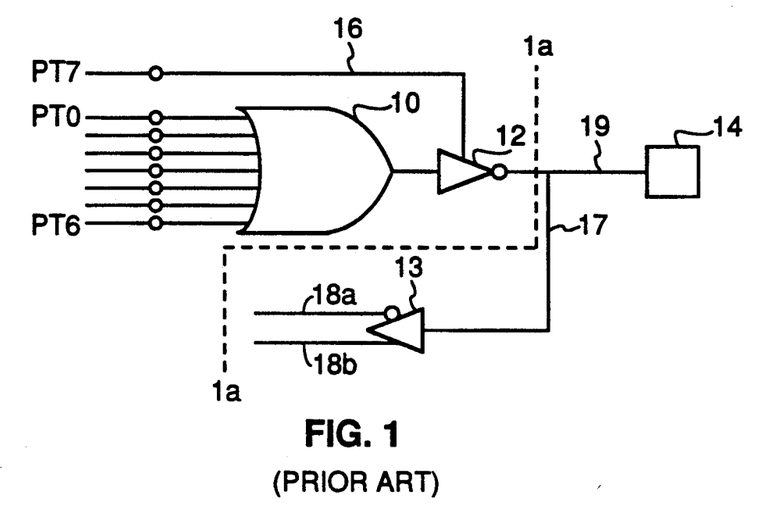
FIG. 1 illustrates an output logic macrocell found in the prior art involving eight input logic signals PT0–PT7 and a combinatorial unregistered output signal which is commonly referred to as an "L-type" output cell structure.
Figure 2:
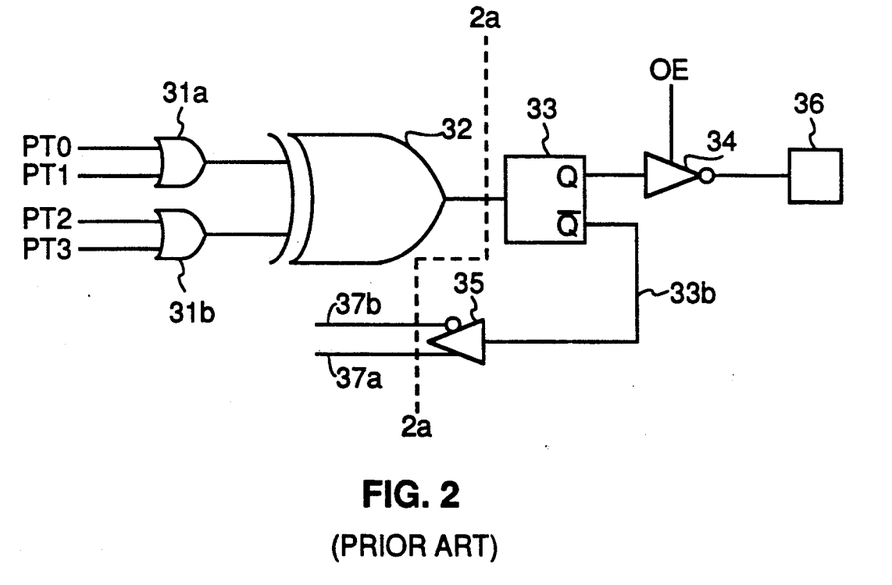
FIG. 2 illustrates an output logic macrocell found in the prior art involving four input logic signals PT0, PT1, PT2 and PT3, an exclusive OR gate and a registered output and feedback from the registered output which is commonly referred to as an "X-type" output cell structure.

As is known in the programmable logic array art, one type of programmable logic array uses what is called an "X-type" output structure where the output signal is passed through an exclusive OR gate and stored in a register (See FIG. 2). Another type of programmable logic circuit uses what is called an "L-type" output structure and has a combinatorial unregistered output (See FIG. 1).

A typical logic output cell for a programmable logic array of the "L-type" is shown in FIG. 1. In FIG. 1, the seven logic signals PT0–PT6 are applied to OR gate 10. The output signal from OR gate 10 optionally is passed through an exclusive OR gate (not shown in FIG. 1) which acts as either a buffer or a programmable invertor for the signal before it reaches tristate output buffer 12. The output signal from buffer 12 is sent to terminal 14. Terminal 14 can be used either as an input path or an output path depending upon the state of tristate buffer 12. If tristate buffer 12 presents a high impedance in response to logic signal PT7 being low level, then terminal 14 functions as an input terminal and the input signal on terminal 14 is transmitted on leads 19 and 17 to buffer 13. Buffer 13 provides on output leads 18b and 18a, true and complemented versions, respectively, of the signal on lead 17 and terminal 14. The structure shown in FIG. 1 provides a logical combinatorial unregistered output signal on lead 19 when buffer 12 acts as a transmission gate for passing the output signal from OR gate 10 to output terminal 14. In this context, lead 17 and buffer 13 are part of a feedback path capable of providing the true and complement of the output signal on terminal 14 to selected points within the programmable logic array.

FIG. 2 illustrates an X-type output structure from a programmable logic array. As shown in FIG. 2, four input logic signals PT0–PT3 are applied in pairs to OR gates 31a and 31b. Logic signals PT0 and PT1 are applied to the two input leads to OR gate 31a and logic signals PT2 and PT3 are applied to the two input leads to OR gate 31b. The output leads from OR gates 31a and 31b are applied to the two input leads to exclusive OR gate 32. The output signal from exclusive OR gate 32 is applied to register 33 (typically a D-type flip-flop). The Q output signal from register 33 is passed through invertor 34 to the output terminal 36. The $\overline{Q}$ output lead from register 33 is fed back through buffer 35 which provides on output leads 37a and 37b, true and complementary versions of the signal on lead 33b, respectively.

The architectures of the output logic circuits with existing programmable logic arrays provide a number of different options to the designer. However, in many cases the use of one option as opposed to another requires the use of a different part or product. This can be a disadvantage if the user wishes to change the design after acquiring a substantial inventory of one type of product.

SUMMARY OF THE INVENTION

In accordance with this invention, an output logic macrocell is provided which is capable of replacing any one of a number of existing output logic architectures. A user is capable of programming the state of the output logic macrocell of this invention to represent any one of a number of different architectures including an X-type output architecture, an L-type output architecture and a number of hybrid architectures which encompass features from one or both of these types.

Among the advantages of the invention are that one logic device incorporating the output logic macrocell of this invention can now be used to replace any one of a number of different product parts previously required to be kept in inventory by a designer using programmable logic arrays.

This invention will be more fully understood in conjunction with the following detailed description taken together with the drawings.

DESCRIPTION OF THE PREFERRED EMBODIMENTS

The following description of this invention is meant to be illustrative only and not limiting. Others skilled in the art may be to able to implement other embodiments of this invention based upon the following descriptions.

Figure 3:
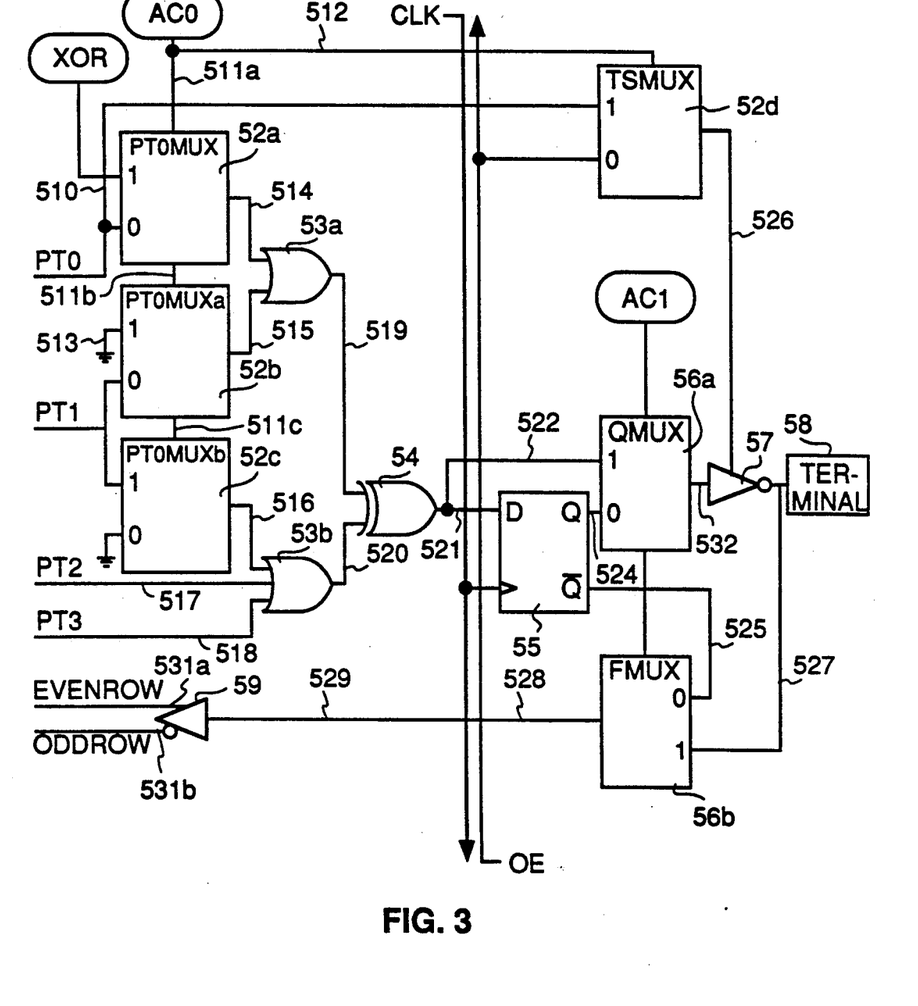
FIG. 3 illustrates the programmable output logic macrocell of this invention.

FIG. 3 shows the logic schematic diagram of one embodiment of the output logic macrocell ("OLMC") of this invention. The output logic macrocell shown in FIG. 3 receives four input logic signals PT0, PT1, PT2 and PT3. These input signals could be any appropriate logic signals from any appropriate source whatsoever. Multiplexers 52a, 52b, 52c and 52d have their states controlled by the control signal AC0. AC0 can assume either a logical 1 or a logical 0. If AC0 assumes a logical 0, multiplexers 52a, 52b, 52c and 52d each connect the input signal on the input lead denoted "0" to the output lead from the multiplexer. If input signal AC0 is a logical "1", then multiplexers 52a, 52b, 52c and 52d connect the input signal on the input lead denoted "1" to the output lead.

The output signals from multiplexers 52a and 52b are transmitted to the two input leads 514, 515 of OR gate 53a. The output signal from multiplexer 52c and the input logic signals PT2 and PT3 are transmitted on leads 516, 517 and 518, respectively, to three corresponding input leads to OR gate 53b.

Exclusive OR gate 54 receives the output signals on leads 519 and 520 from OR gates 53a and 53b, respectively, and provides an output signal on lead 521 to the D input of register 55. Exclusive OR gate 54 also provides an output signal on lead 522 to the "1" input lead of output multiplexer 56a. The "0" input lead to output multiplexer 56a is connected by lead 524 to the Q output lead of register 55 (typically a D-type flip-flop). The $\overline{Q}$ output lead from register 55 is connected by lead 525 to the "0" input lead of feedback multiplexer 56b. The "1" input lead of feedback multiplexer 56b is connected by lead 527 to output terminal 58. The output signal from feedback multiplexer 56b is transmitted on lead 528 to buffer inverter 59. Buffer inverter 59 produces on output leads 531a and 531b, two output signals corresponding to the true and complement, respectively, of the signal on input lead 528.

Control signal AC1 controls the states of output multiplexer 56a and feedback multiplexer 56b. If AC1 is a low level signal or "0", output multiplexer 56a connects the input signal on the "0" input lead of output multiplexer 56a to the output lead 532. Likewise, feedback multiplexer 56b connects the signal on the "0" input lead to feedback multiplexer 56b to output lead 528. If AC1 is a high level signal, then output multiplexer 56a connects the input signal on the "1" input lead to the output multiplexer 56a to the output lead 532. Likewise, feedback multiplexer 56b connects the signal on its "1" input lead to output lead 528. Input lead "1" of feedback multiplexer 56b is connected by conductor 527 to terminal 58.

As shown in FIG. 3, a clock lead denoted CLK and an output enable lead denoted OE are provided as part of the output logic macrocell of this invention. Clock lead CLK transmits a clock signal (which may be either synchronous or asynchronous depending upon the logic to be implemented using the output logic macrocell) to the clocking input of register 55. The output enable lead OE provides an output enable signal to multiplexer 52d which is transmitted through multiplexer 52d from the "0" input lead to the output lead of this multiplexer and then on lead 526 to buffer 57 to enable buffer 57 to function as a transmission gate rather than as a high impedance.

A logic array incorporating the output logic macrocell of this invention will, in general, include a plurality of such macrocells. For example, a programmable logic array might use ten such macrocells and the clock lead CLK and output enable lead OE will be common to all such macrocells. The user will program or configure each macrocell to connect the clock lead CLK and the output enable lead OE to the appropriate logical components in each macrocell as required to implement the desired logic function.

Figure 4:
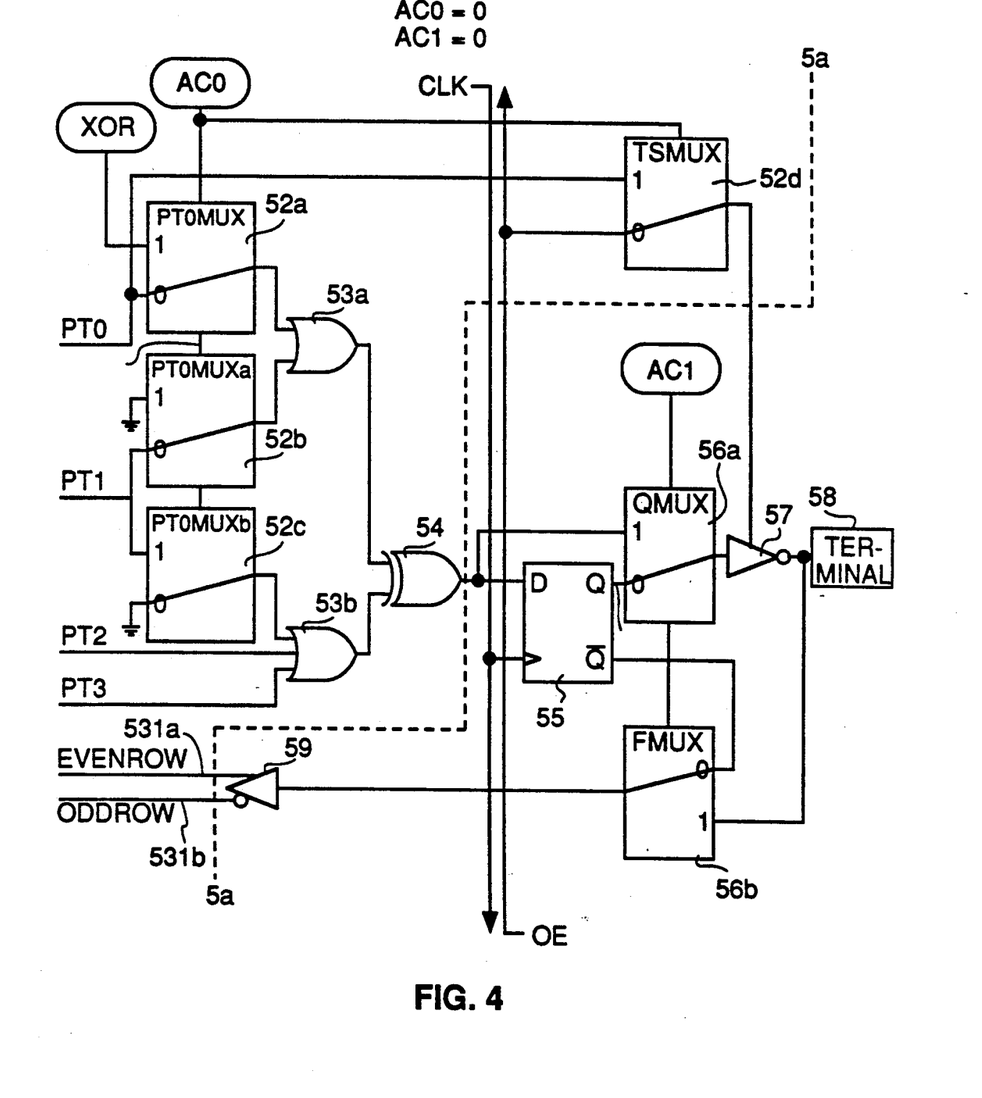
FIGS. 4, 5, 6 and 7 illustrate the configurations of the structure of FIG. 3 in response to the four possible states of the programming signals, AC0 and AC1.

FIG. 4 illustrates the state of the circuit of FIG. 3 when AC0 equals 0 and AC1 equals 0. As shown in FIG. 4, when AC0 equals 0, input multiplexers 52a, 52b, 52c and 52d each form a signal path from the "0" input lead to the output lead. The solid line drawn across each of these four multiplexers illustrates the signal connection for AC0 equals 0. When AC1 also equals "0" the signal transmitted through output multiplexer 56a is from the "0" input lead to the output lead as shown by the line drawn across output multiplexer 56a. Likewise, feedback multiplexer 56b connects the signal on its "0" input lead to the output lead as shown by the line drawn across feedback multiplexer 56b in FIG. 4. Accordingly, the circuit depicted by FIG. 4 is equivalent to the structure shown in FIG. 2 with the input logic signals PT0 and PT1 being transmitted directly to the two input leads of OR gate 53a (corresponding to OR gate 31a in FIG. 2) and the input logic signals PT2 and PT3 being transmitted directly to the two input leads to OR gate 53b (corresponding to OR gate 31b in FIG. 2). The third input lead to OR gate 53b is connected to ground through multiplexor 52c and therefore rendered inoperative. The output signals from OR gates 53a and 53b are transmitted to exclusive OR gate 54 (corresponding to exclusive OR gate 32 in FIG. 2) and the output signal from exclusive OR gate 54 is then transmitted to register 55 (corresponding to register 33 in FIG. 2). The Q output signal from register 55 is transmitted through output multiplexer 56a directly to tristate output buffer 57 (which corresponds to output buffer 34 in FIG. 2) and from there to output terminal 58 (which corresponds to output terminal 56 in FIG. 2). The output signal from the $\overline{Q}$ output lead of register 55 is transmitted through feedback multiplexer 56b directly to buffer inverter 59 (corresponding to buffer inverter 35 in FIG. 2). Buffer inverter 59 produces the true and complement of the output signal on terminal 58 on leads 531a and 531b, respectively. Thus the state AC0 equals 0 and AC1 equals 0 causes the OLMC of this invention to assume the configuration of the structure shown in FIG. 2. This structure corresponds to programmable logic parts of the types commonly known in the industry as the 20X10, 20X8 and 20X4.

Figure 5:
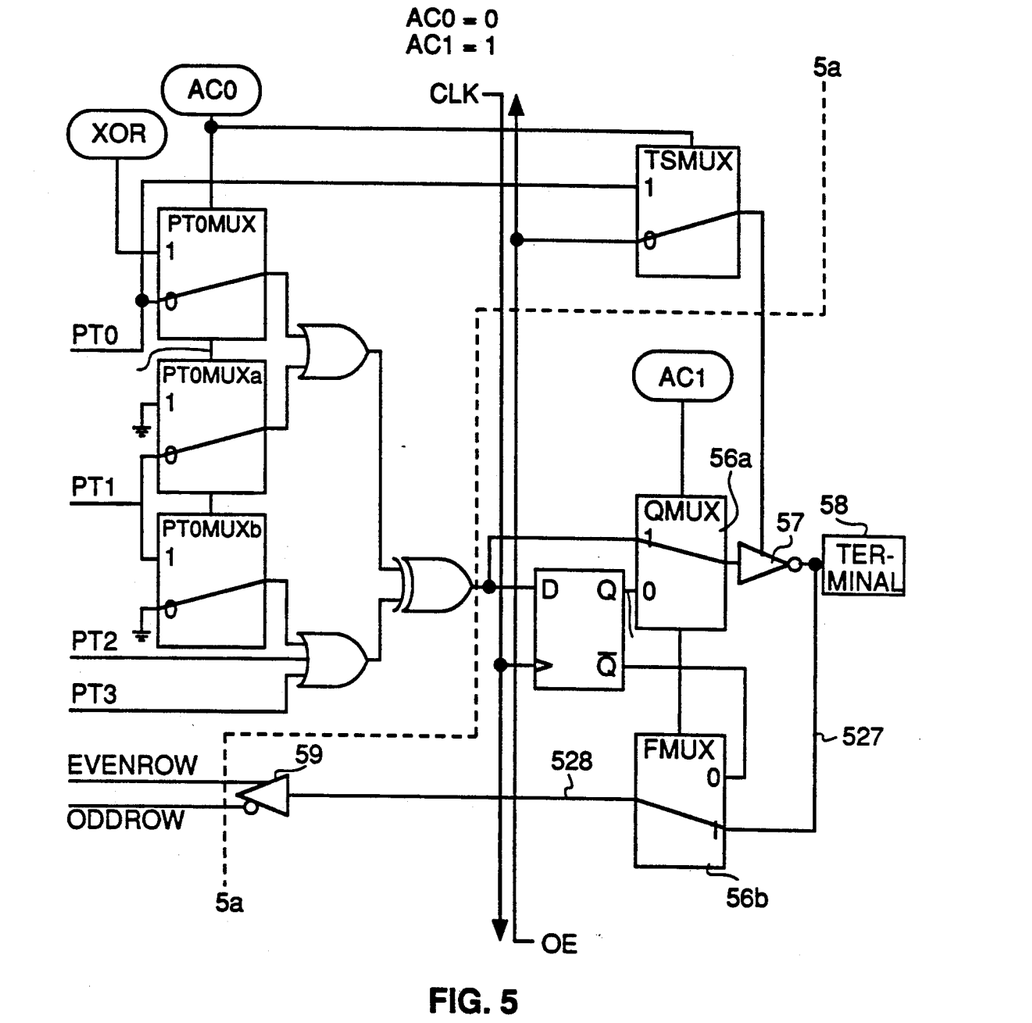

FIG. 5 illustrates the configuration of the OLMC of this invention in response to AC0 equals 0 and AC1 equals 1. In FIG. 5 the configuration of multiplexers 52a through 52d and OR gates 53a, 53b and exclusive OR gate 54 is the same as in FIG. 4. However output multiplexer 56a and feedback multiplexer 56b are configured differently because the level of control signal AC1 is now high corresponding to a binary 1 in positive logic. Accordingly, the "1" input lead of output multiplexer 56a is connected to the output lead from output multiplexer 56a in response to AC1 equals "1" and therefore to the input lead of tristate buffer 57. The "1" input lead of feedback multiplexer 56b is connected to input lead 527 from terminal 58 and is connected to the output lead 528 of feedback multiplexer 56b. Accordingly, this configuration corresponds to an unregistered output transmitted directly to output terminal 58 through inverter 57 and feedback from the output terminal transmitted directly to feedback buffer 59 on leads 527 and 528. This configuration comprises a new superset of an output configuration for a programmable logic array.

Figure 6:
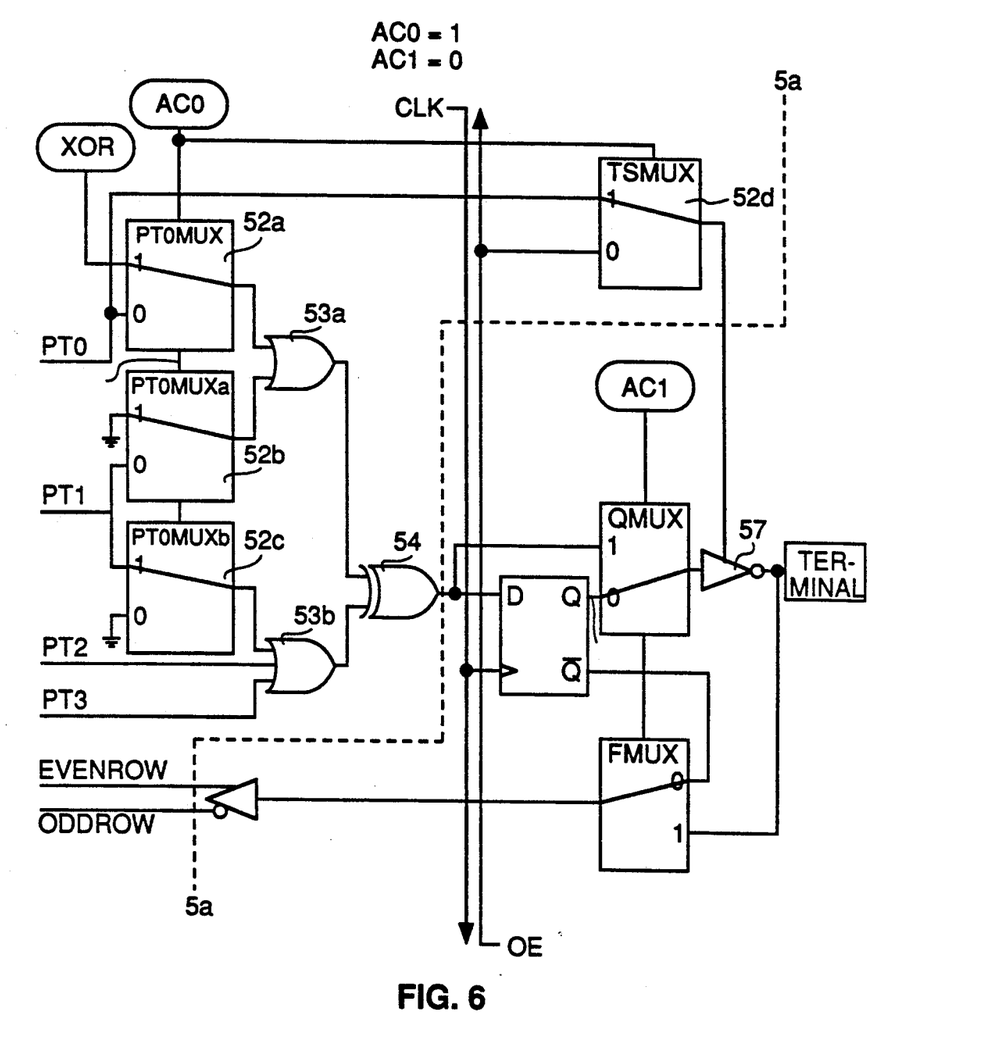

FIG. 6 illustrates the configuration of the OLMC of this invention in response to AC0 equal 1 and AC1 equal 0. The configuration of FIG. 6 is the same as the configuration of FIG. 4 except that multiplexers 52a, 52b, 52c and 52d have their input signals on the "1" input leads to these multiplexers connected directly through these multiplexers to their corresponding output leads. Thus the structure of FIG. 6 corresponds to a composite of the structures shown in FIGS. 1 and FIG.

2. In particular, a registered output signal is provided with registered feedback but with one logic signal PT0 being used to control the state of tristate output buffer 57, a second logic signal PT1 being transmitted to one input lead of OR gate 53b while the other logic signals PT2 ad PT3 are transmitted to the other two input leads of OR gate 53b. Thus the portion of the circuit controlled by the state of signal AC0 corresponds to the portion of the circuit depicted in FIG. 1 to the left of dashed line 1a while the portion of the circuit controlled by AC1 corresponds to the circuit shown in FIG. 2 to the right of the dashed line 2a.

Figure 7:
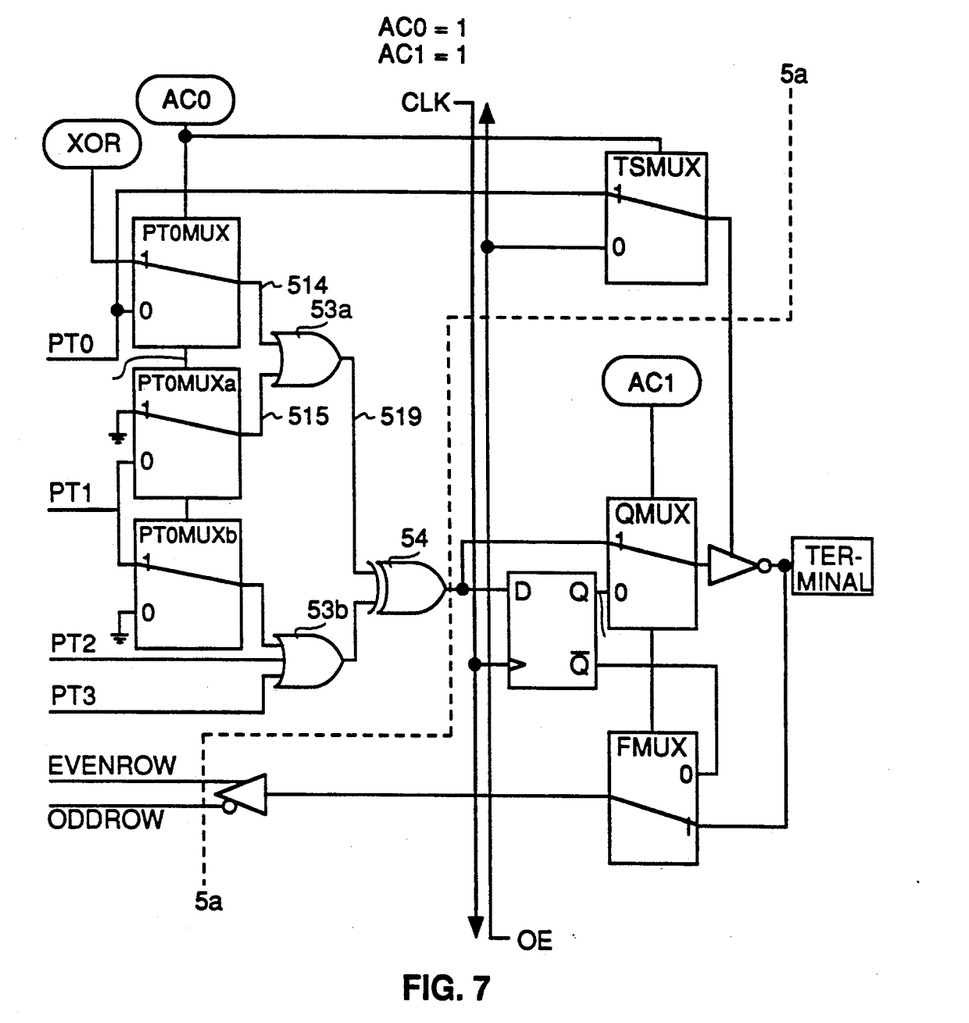

FIG. 7 illustrates the OLMC of this invention shown in FIG. 3 with AC0 equal 1 and AC1 equal 1. This particular circuit corresponds in configuration to the portion of the circuit shown in FIG. 6 to the left of the line labelled 5a and to the structure in FIG. 5 to the right of the line labelled 5a. Accordingly, this particular configuration corresponds to an L-type unregistered combinatorial output with a three input OR gate and a fourth input logic signal to act as a programmable inverter. Thus in FIG. 7, lead 514 to OR gate 53a is connected to signal source XOR which carries a control signal that is used to determine whether exclusive OR gate 54 is used as an inverter or merely as a non-inverting buffer. If XOR is a high level binary 1, then exclusive OR gate 54 acts as an inverter. If XOR is a low level binary 0, then exclusive OR gate 54 acts merely as a buffer.

While the OLMC of tis invention is described as an output logic macrocell, this circuit can also be used as a logical component of any circuit to operate upon a plurality of input signals (whether or not logic signals) and to produce a single output signal in response thereto. Thus the OLMC can, in fact, be a component at an appropriate position in any logic circuit and can be used to provide a logical output signal and a feedback signal as appropriate.

The OLMC depicted in FIGS. 3-7 is constructed of two portions, one portion on one side of the line 5a and the other portion on the other side of the line 5a. The portion to the left and above line 5a is controlled by signal AC0 while the portion to the right and below line 5a is controlled by AC1. The two portions can be independently controlled to provide the desired architectural flexibility inherent in the structure of this invention. If the control signals AC0, AC1 and XOR are considered input signals, then the OLMC of this invention operates with seven input signals (AC0, AC1, XOR, PT0, PT1, PT2 and PT3) and one output signal (the output signal on the output terminal 58). The circuit also is capable of having either registered or unregistered feedback together with a bi-directional output terminal depending upon the state of PT0 when AC0 equals 1.

The following table summarizes the various states of the OLMC of this invention.

TABLE

| AC0 | AC1 | XOR | State of OLMC |
|---|---|---|---|
| 0 | 0 | Don't Care | Two input OR gates, XOR gate 54, registered output and registered feedback |
| 0 | 1 | Don't Care | Two input OR gates, XOR gate 54, unregistered output and unregistered feedback |
| 1 | 0 | 0 | One input OR gate; Gate 54 is buffer; registered output and registered feedback |

TABLE-continued

| AC0 | AC1 | XOR | State of OLMC |
|---|---|---|---|
| 1 | 0 | 1 | One input OR gate; Gate 54 is inverter; registered output and registered feedback |
| 1 | 1 | 0 | One input OR gate; Gate 54 is buffer; unregistered output and unregistered feedback |
| 1 | 1 | 1 | One input OR gate; Gate 54 is inverter; unregistered output and unregistered feedback |

The structure of this invention accomplishes two important things. First, it provides simple sum of product logic functions of a type commonly used in programmable logic arrays. But the circuit also provides exclusive-OR based logic functions of a type useful in arithmetic and parity correction operations using the same circuitry. The ability to do both types of operations with the same circuitry provides a significant advantage to the user of programmable logic parts incorporating this invention.

The exclusive OR gate 54 used in this invention can include an exclusive NOR gate of the type disclosed, for example, in the copending patent application filed the same day as this application, by Milton M. Hood, Jr. entitled: "XNOR GATE WITH MINIMUM TRANSISTOR COUNT AND EQUAL DELAYS THROUGH BOTH PATHS" and assigned to Lattice Semiconductor Corporation, the assignee of this application. Mr. Hood's application is incorporated by reference in its entirety. Mr. Hood's exclusive NOR gate is followed by an inverter to yield the exclusive OR gate 54 used in FIGS. 3-7.

While one embodiment of this invention has been described, other embodiments of this invention will be obvious to those skilled in the art in view of this description.

What is claimed is:

1. A programmable logic macrocell comprising:
    circuit means for providing logic functions;
    means for providing a single control signal having a first voltage condition and a second voltage condition;
    means responsive to said first condition of said control signal for configuring said circuit means to provide sum of product logic functions; and
    means responsive to said second condition of said control signal for configuring said circuit means to provide exclusive OR based logic functions.

2. Structure as in claim 1, wherein said circuit means comprises:
    means responsive to said first condition of said control signal for configuring said circuit means to represent a first OR gate with a first selected plurality of input leads applied thereto;
    tristate buffer means connected to the output of said first OR gate;
    an output lead from said tristate buffer means connected to an output terminal;
    means for controlling the state of said tristate buffer means thereby to allow said output terminal to function either as an input or an output terminal; and
    an inverter means between the output of said OR gate and the input of said tristate buffer means, said inverter means being controllable to either invert or not invert the output signal of said OR gate.

3. A macrocell for use in a logical circuit comprising circuitry capable of assuming any one of a plurality of defined configurations, said macrocell including means for providing a first signal having a first voltage condition and a second voltage condition, means for providing a second signal having a first voltage condition and a second voltage condition, and means for providing a third signal having a first voltage condition and a second voltage condition, said macrocell comprising:

means responsive to said first condition of said first signal and said first condition of said second signal for configuring said circuitry to provide a plurality of input OR gates, each input OR gate having a selected number of input leads, to provide an exclusive OR gate for receiving the output leads from each input OR gate and to provide a registered output and registered feedback from said circuit;

means responsive to said first condition of said first signal and said second condition of said second signal for configuring said circuit to provide a plurality of input OR gates, each OR gate having a selected number of input leads, to provide an exclusive OR gate for receiving the output leads from each input OR gate, and to provide an unregistered output terminal and an unregistered feedback path;

means responsive to said second condition of said first signal and said first condition of said second signal and said first condition of said third signal for configuring said circuit to provide a single OR gate input with a selected number of input leads, a butter between the output of said OR gate and an output path, a registered output terminal and a registered feedback path;

means responsive to said second condition of said first signal and said first condition of said second signal and said second condition of said third signal for configuring said circuit to provide a single input OR gate with a selected number of input leads, an inverter connecting said single input OR gate to said output path, a registered output path and a registered feedback path;

means responsive to said second condition of said first signal and said second condition of said second signal and said first condition of said third signal for configuring said circuit to provide a single OR gate with a selected number of input leads, a buffer between the output of said OR gate and an output path, an unregistered output path and an unregistered feedback path; and means responsive to said second condition of said first signal and said second condition of said second signal and said second condition of said third signal for configuring said circuit to provide a single OR gate with a selected number of inputs, an inverter between the output of said OR gate and an output path and an unregistered output path connected to said inverter and an unregistered feedback path connected to said output path.

4. Structure as in claim 3, wherein said inverter comprises an exclusive OR gate.

5. An output logic macrocell capable of representing any one of a number of architectures including:

means for providing a plurality of control signals;

multiplexer means operatively coupled to said means for providing control signals, said multiplexer means comprising one or more multiplexers;

means, including said multiplexer means, responsive to a first combination of condition of said control signals for configuring said output logic macrocell to represent an X-type output architecture;

means, including said multiplexer means, responsive to a second combination of condition of said control signals for configuring said output logic macrocell to represent an L-type output architecture; and means, including said multiplexer means, responsive to a combination of condition other than said first combination and said second combination of said control signals for configuring said output logic macrocell to represent any one of a number of hybrid architectures which encompass features from one or both of the X-type and L-type output architectures.

6. A macrocell for use in a logical circuit comprising circuitry capable of assuming any one of a plurality of defined configuration:

means for configuring said circuitry to provide a plurality of input OR gates, each input OR gate having a selected number of input leads, to provide an exclusive OR gate for receiving the output leads from each input OR gate and to provide a registered output and registered feedback from said circuit;

means for configuring said circuit to provide a plurality of input OR gates, each OR gate having a selected number of input leads, to provide an exclusive OR gate for receiving the output leads from each input OR gate, and to provide an unregistered output terminal and an unregistered feedback path;

means for configuring said circuit to provide a single OR gate input with a selected number of input leads, a butter between the output of said OR gate and an output path, a registered output terminal and a registered feedback path;

means for configuring said circuit to provide a single input OR gate with a selected number of input leads, an inverter connecting said single input OR gate to said output path, a registered output path and a registered feedback path;

means for configuring said circuit to provide a single OR gate with a selected number of input leads, a buffer between the output of said OR gate and an output path, and unregistered output path and an unregistered path; and means for configuring said circuit to provide a single OR gate with a selected number of inputs, an inverter between the output of said OR gate and an output path and an unregistered output path connected to said inverter and an unregistered feedback path connected to said output path;

wherein said inverter comprises an exclusive OR gate.

7. A macrocell for use in a logical circuit comprising circuitry capable of assuming any one of a plurality of defined configurations, said macrocell including means for providing a first signal having a first voltage condition and a second voltage condition and means for providing a second signal having a first voltage condition and a second voltage condition, said macrocell comprising:

means responsive to said first condition of said first signal and said first condition of said second signal for configuring said circuitry to provide a plurality of input OR gates, each input OR gate having a selected number of input leads, to provide an exclusive OR gate for receiving the output leads from each input OR gate and to provide a registered output and registered feedback from said circuit;

means responsive to said first condition of said first signal and said second condition of said second signal for configuring said circuit to provide a plurality of input OR gates, each OR gate having a selected number of input leads, to provide an exclusive OR gate for receiving the output leads from each input OR gate, and to provide an unregistered output terminal and an unregistered feedback path;

means responsive to said second condition of said first signal and said first condition of said second signal for configuring said circuit to provide a single OR gate input with a selected number of input leads, a registered output terminal and a registered feedback path;

means responsive to said second condition of said first signal and said second condition of said second signal for configuring said circuit to provide a single OR gate with a selected number of inputs, and an unregistered output terminal and an unregistered feedback path.

8. A programmable logic macrocell comprising:
circuit means for providing logic function;
means for providing a control signal;
means, including one or more multiplexers, responsive to a first condition of said control signal for configuring said circuit means to provide sum of product logic functions; and
means, including one or more multiplexers, responsive to a second condition of said control signal for configuring said circuit means to provide exclusive OR based logic functions.

9. Structure as in claim 8, wherein said circuit means comprises:
means responsive to said first condition of said control signal for configuring said circuit means to represent a first OR gate with a first selected plurality of input leads applied thereto;
tristate buffer means connected to the output of said first OR gate;
an output lead from said tristate buffer means connected to an output terminal;
means for controlling the state of said tristate buffer means thereby to allow said output terminal to function either as an input or an output terminal; and
an inverter means between the output of said OR gate and the input of said tristate buffer means, said inverter means being controllable to either invert or not invert the output signal of said OR gate.

10. A macrocell for use in a logical circuit comprising circuitry capable of assuming any one of a plurality of defined configurations, said macrocell comprising:
means for providing a first signal, a second signal and a third signal;
multiplexer means operatively coupled to said means for providing a first signal, a second signal, and a third signal, said multiplexer means comprising one or more multiplexers;
means, including said multiplexer means, responsive to a first condition of said first signal and a first condition of said second signal for configuring said circuitry to provide a plurality of input OR gates, each input OR gate having a selected number of input leads, to provide an exclusive OR gate for receiving the output leads from each input OR gate and to provide a registered output and registered feedback from said circuit;

means, including said multiplexer means, responsive to said first condition of said first signal and a second condition of said second signal for configuring said circuit to provide a plurality of input OR gates, each OR gate having a selected number of input leads, to provide an exclusive OR gate for receiving the output leads from each input OR gate, and to provide an unregistered output terminal and an unregistered feedback path;

means, including said multiplexer means, responsive to a second condition of said first signal and said first condition of said second signal and a first condition of said third signal for configuring said circuit to provide a single OR gate input with a selected number of input leads, a buffer between the output of said OR gate and an output path, a registered output terminal and a registered feedback path;

means, including said multiplexer means, responsive to said second condition of said first signal and said first condition of said second signal and a second condition of said third signal for configuring said circuit to provide a single input OR gate with a selected number of input leads, an inverter connecting said single input OR gate to said output path, a registered output path and a registered feedback path;

means, including said multiplexer means, responsive to said second condition of said first signal and said second condition of said second signal and said first condition of said third signal for configuring said circuit to provide a single OR gate with a selected number of input leads, a buffer between the output of said OR gate and an output path, an unregistered output path and an unregistered feedback path, and means, including said multiplexer means, responsive to said second condition of said first signal and said second condition of said second signal and said second condition of said third signal for configuring said circuit to provide a single OR gate with a selected number of inputs, an inverter between the output of said OR gate and an output path and an unregistered output path connected to said inverter and an unregistered feedback path connected to said output path.

11. Structure as in claim 10, wherein said inverter comprises an exclusive OR gate.

12. A macrocell for use in a logical circuit comprising circuitry capable of assuming any one of a plurality of defined configuration, said macrocell comprising:
means for providing a first signal and a second signal;
multiplexer means operatively coupled to said means for providing a first and a second signal, said multiplexer means comprising one or more multiplexers;
means, including said multiplexer means, responsive to a first condition of said first signal and a first condition of said second signal for configuring said circuitry to provide a plurality of input OR gates, each input OR gate having a selected number of input leads, to provide an exclusive OR gate for receiving the output leads from each input OR gate and to provide a registered output and registered feedback from said circuit;

means, including said multiplexer means, responsive to said first condition of said first signal and a second condition of said second signal for configuring said circuit to provide a plurality of input OR gates, each OR gate having a selected number of input leads, to provide an exclusive OR gate for receiving the output leads from each input OR gate, and to provide an unregistered output terminal and an unregistered feedback path;

means, including said multiplexer means, responsive to a second condition of said first signal and said first condition of said second signal for configuring said circuit to provide a single OR gate input with a selected number of input leads, a registered output terminal and a registered feedback path;

means, including said multiplexer means, responsive to said second condition of said first signal and said second condition of said second signal for configuring said circuit to provide a single OR gate with a selected number of inputs, and an unregistered output terminal and an unregistered feedback path.

* * * * *